United States Patent [19]

Koening

[11] Patent Number: 4,996,717
[45] Date of Patent: Feb. 26, 1991

[54] RADIO RECEIVER NOISE SQUELCHING AND OPERATIONAL INDICATING ALARM

[76] Inventor: Robert H. Koening, Rd. 1, Coats Rd., Burdett, N.Y. 14818

[21] Appl. No.: 427,725

[22] Filed: Oct. 26, 1989

[51] Int. Cl.$^5$ .......................................... H04B 1/10
[52] U.S. Cl. ................................. 455/222; 455/223; 455/35; 455/156
[58] Field of Search .............. 455/228, 218, 223, 35, 455/36, 226, 156, 154, 221, 343, 221; 375/104; 379/58; 340/311.1

[56] References Cited

U.S. PATENT DOCUMENTS

| | | | |
|---|---|---|---|
| 2,982,854 | 5/1961 | Durkee . | |
| 2,992,327 | 7/1961 | Lennon et al. . | |
| 3,015,728 | 1/1962 | Richman . | |
| 3,038,071 | 6/1962 | Durkee . | |
| 3,102,236 | 8/1963 | Eichenberger et al. . | |
| 3,296,535 | 1/1967 | Murrary . | |
| 3,339,144 | 8/1967 | Squires . | |
| 3,350,650 | 10/1967 | Kemper . | |
| 3,873,926 | 3/1975 | Wright . | |
| 3,894,285 | 7/1975 | Schaeperkoetter . | |
| 4,020,421 | 4/1977 | Elder et al. . | |
| 4,044,309 | 8/1977 | Smith . | |
| 4,241,453 | 12/1980 | Drake | 455/219 |
| 4,455,682 | 6/1984 | Masters | 455/300 |
| 4,703,507 | 10/1987 | Holden | 381/94 |
| 4,718,115 | 1/1988 | Inoue | 455/218 |
| 4,724,545 | 2/1988 | Hamada | 455/218 |
| 4,731,873 | 3/1988 | Voyce | 455/219 |

*Primary Examiner*—Reinhard J. Eisenzopf
*Assistant Examiner*—Lisa D. Charouel
*Attorney, Agent, or Firm*—Ralph R. Barnard

[57] ABSTRACT

A clock-driven pulse source is used to apply repetitive short pulses to the squelch control connection point of the squelch circuitry of a radio receiver to deactivate momentarily the squelch circuitry at regular intervals. This provides periodic noise bursts of "de-squelch" pulses on an otherwise silent radio in order to inform the radio operator that the radio is live and that the volume is adequate. A light may also be connected to the system to provide a second, visual, indicator of the operational status of the radio. This radio receiver operational checking system may also be utilized where there are two or more radios in use by providing an additional clock-driven pulse source for each radio in use. The system may be arranged so that the status of individual radios may be quickly ascertained by sound and/or by light indicators.

12 Claims, 2 Drawing Sheets

FIGURE 2A. Clock Signal

FIGURE 2B. Radio 1 De-Squelch Pulse

FIGURE 2C. Radio 2 Spacer Pulse for Dual De-Squelch

FIGURE 2D. Radio 2 De-Squelch Pulse

FIGURE 2E. Noise Burst from Headphone Line -- Amplified

FIGURE 2F. Co-Incident Gate Trigger for Radio 1 Light

FIGURE 2G. Stretched Pluse for Radio 1 LED Indicator

FIGURE 2H. Co-Incident Gate Trigger for Radio 2 Light

FIGURE 2J. Stretched Pulse for Radio 2 LED Indicator

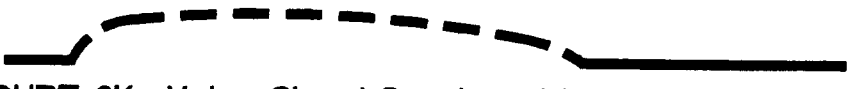

FIGURE 2K. Voice Signal Sensing at Headphones
(amplified, rectified, integrated)

FIGURE 2L. Light Disabling Signal

RADIO RECEIVER NOISE SQUELCHING AND OPERATIONAL INDICATING ALARM

BACKGROUND OF THE INVENTION

1. Field of the Invention

This invention relates to a radio receiver operational checking system using the radio receiver's active signal squelch circuit to measure the operability of a radio receiver including identifying which receiver is being checked where a plurality of radio receivers are being monitored.

2. Description of the Related Art

For years, radio receivers used in aircraft, military, mobile and other, critical radiant-energy communication links have used circuitry known as "squelch" to make the receiver silent until a "threshold" signal strength is reached, at which time full listening power is activated. Receivers with squelch have a knob for the operator to adjust to the critical silencing point, or "threshold." In some receivers, the adjustment is preset and a pull-knob disables squelch entirely, giving full background noise when volume is turned up. Without the squelch circuitry, there is a continual noise in the form of loud hissing or crackling, commonly known as background noise. The noise is distracting and unpleasant; hence, the use of squelch circuitry systems.

For example, in aviation, where almost everything is duplicated, it is common practice to install two receivers, one for standby, even in small aircraft. Although failure is unlikely, the chance exists that any one of the thousands of electronic components in each of the receivers may cause a system failure. If so, there is nothing to indicate when a squelch-silenced receiver becomes a dead receiver. This could be serious if the aircraft is being flown on instruments in the clouds, if the controller must be heard in order to keep the plane, pilot and passengers safe, or in any number of other situations where it is crucial to have an operative radio.

Some pilots and communicators disable squelch and tolerate the noise in order to know that the radio is live. Others leave the squelch control on and trust blindly to fate. Still others bungle and foul up their communication by inadvertently having the radio turned down or off.

U.S. Pat. No. 4,718,115 (Inoue), entitled "RADIO RECEIVER FOR CARRYING OUT SELF DIAGNOSIS WITHOUT INTERFERENCE," is of interest as a general reference in this case as it discloses the category of prior art where a separate diagnostic signal is introduced in the path of the incoming signal as it goes through the radio receiver. This category of prior art is distinctively different from the present invention in that the invention, which is to be described herein, periodically deactivates the squelch circuitry as a method of determining the operational status of the radio and does not use a separate diagnostic signal.

SUMMARY OF THE INVENTION

In the following discussion, subliminal or near-subliminal refers to pulse duration which is long enough to be heard without being intrusive or annoying.

This invention solves the problem of determining the operational status of squelch-silenced radios, and further adds the option of having an effectively silent radio when no voice is present, by providing near-subliminal short bursts of full-sensitivity receiver noise to indicate that the radio is operational and that the volume is adequately adjusted. In addition, if more than one radio is being used, the system indicates which of the radios are properly live.

It is therefore an object of this invention to provide a monitoring means for radio receivers which employ squelch silencing, particularly the type used in aircraft communications, as well as other types of communications.

It is another object of this invention to provide means to indicate which of several radios are active and truly live, even though the receiver is essentially silenced by squelch.

It is still another object of this invention to provide means for giving radio operators assurance that their receiving equipment has not failed and is live, even though the speaker or headphones are essentially silenced by squelch.

It is still another object of this invention to prevent inadvertent mix-ups of adjustment of multiple communication radios or other communication set-up on an aircraft.

It is still another object of this invention to provide means for informing a pilot or radio operator coming new on the watch that there is reception and which particular radios are adjusted live.

The foregoing objectives are achieved by the present invention by means of a clock driven pulse source for each radio receiver to provide repetitive narrow pulses to deactivate momentarily each radio's noise squelch circuit at regular intervals, to give indication that the said radio receiver is operational and awaiting a radio frequency signal.

Further objectives may be found in the following drawing, specification and claims.

BRIEF DESCRIPTION OF THE DRAWINGS

FIGS. 2A–L show the wave-form/pulse timing of the signals generated using the invention.

DETAILED DESCRIPTION OF THE INVENTION

Figure 1:
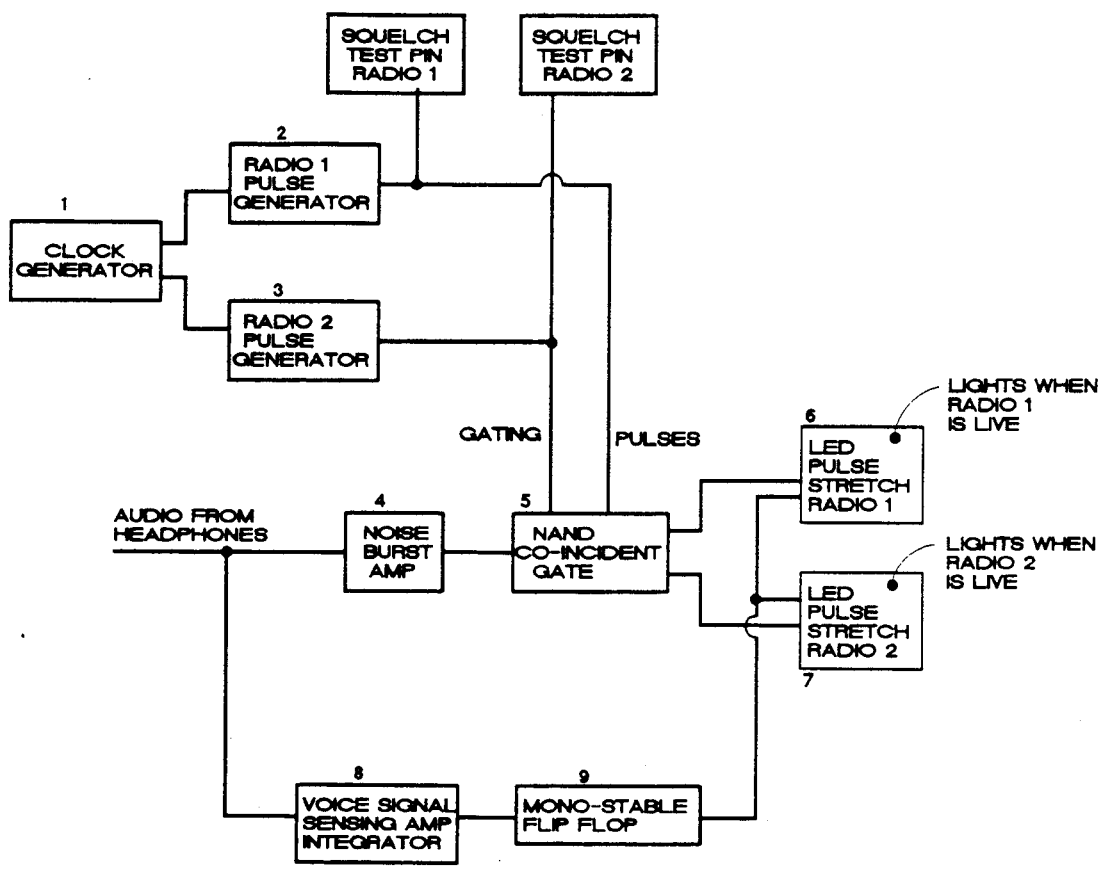
FIG. 1 is a block diagram of the circuitry of the invention.

Referring primarily to FIG. 1, the clock generator (Block (1) creates a rectangular symmetrical wave-form of approximately two seconds between transitions (FIG. 2A). Radio 1 pulse generator (Block 2) is triggered when the transition goes from high to low, and generates a ten millisecond pulse (FIG. 2B) which is sent to deactivate momentarily the Radio 1 squelch circuit. Subsequent clock pulse transition from low to high triggers the radio 2 pulse generator (Block 3). The output pulse pair (FIG. 2D) is likewise wired to the squelch circuit of Radio 2 to deactivate momentarily the squelch and pass the bursts of noise. These pulses are grouped to identify which radio is being checked; thus, double pulse is Radio 2 and single pulse is Radio 1.

The equipment as described above is adequate to perform the audible communication checking claimed in this invention, since the pilot or communicator can hear the periodic noise burst from the "de-squelch" pulses. Note that the squelch system of the radio keeps the radio silent when there is no signal.

This system may be enhanced with the use of indicator lights (shown in FIG. 1). Blocks 4, 5, 6, 7 provide visual indication to show which radio or radios are live. A Light-Emitting Diode (LED) connected to each radio shows when a particular radio is turned on and adjusted for audible reception.

A noise burst amplifier (Block 4) "listens" on the headphone audio line for any sound. This line would be squelched silent with zero audio signal when no voice transmission was being received—if it were not for the pulsed noise bursts. Block 4 amplifies these noise bursts when heard at headphone level. The pulse, if present, is amplified and shaped in Block 4 and is passed to a NAND gate (Block 5). This gate passes the pulse on to Block 6 (Radio 1 LED light pulse stretch) if the noise burst pulse occurs coincident with Radio 1 pulses. Similarly, if headphone noise pulses are co-incident with Radio 2 gating pulses, they are sent to Block 7 (LED pulse stretch for Radio 2).

If Radio 1 and Radio 2 pulses are heard on headphones coincident with their respective gating pulses, BOTH lights will come on. Blocks 6 and 7 (LED pulse stretches), when triggered from the gate, turn on the LEDs for most of the four second period between similar pulses. This gives nearly continuous light indication to show which radio is live. The short period during which the indicator blinks dark in each period is a self-checking feature which shows that the light is dependent on the audio noise pulse and is therefore a valid indicator.

Blocks 8 and 9 disable both indicator lights when voice communication is being received. This is shown in FIGS. 2K and 2L. Voice reception would confuse the indication because voice audio signal is present at the sampling instants for the noise pulse checking. This circuit solves the trouble of both lights coming on erratically when voice is present by preventing either light from turning on when voice is present.

A logarithmic response is used to accommodate wide variations in audio level at the headphone line.

In an embodiment of this invention, Blocks 1-3, 5 and 6 in FIG. 1 are made up of integrated circuit (IC) chips of the "TIMER" classification, which are standard eight (8) pin chips. For compact packaging, dual or multiple units can be used. The economical type 555 or 556 have been used. Block 4 can be a 741 Op Amp IC and Block 5 a 7400 Quadrangle NAND Gate IC. Block 8 is an Op Amp IC such as a type 741; Block 9 is a Timer IC such as a type 555. These parts are illustrative only and are not limiting in any way.

The foregoing description has been directed to particular embodiments of the invention in accordance with the requirements of the Patent Statutes for the purposes of illustration and explanation. It will be apparent, however, to those skilled in this art that many modifications and changes will be possible without departure from the scope and spirit of the invention. It is intended that the following claims be interpreted to embrace all such modifications.

What is claimed is:

1. A radio receiver operational checking system comprising in combination:
   (a) a radio receiver including an active radio noise squelch circuit, set at a level to eliminate ambient noise (atmospheric and receiver noise) when no radio signal is being received, and including a squelch control connection point where said squelch circuit can be disabled by the application of a voltage of appropriate magnitude,
   (b) a clock-driven pulse source for said radio receiver providing repetitive short pulses for application to said squelch control connection point to deactivate momentarily said noise squelch circuit at regular intervals to provide repetitive, short noise pulses in the audio output of said radio receiver indicating that said radio receiver is operational and awaiting a radio frequency signal.

2. The radio receiver operational checking system of claim 1 further comprising light indicating means for said radio receiver to monitor visually said audio short noise pulse outputs of said receiver and to turn on when said short noise pulse output of said receiver coincides with said short pulses from said clock-driven pulse source being applied to said squelch control connection point of said radio receiver as an indication of the operability of said receiver.

3. The radio receiver operational checking system of claim 1 wherein there are a plurality of radio receivers and a clock-driven differing pulse source for each of said radio receivers.

4. The radio receiver operational checking system of claim 3 wherein said clock-driven differing pulse sources are spaced in time and waveform such that the audio output of each radio receiver is audibly distinguishable from each other.

5. The radio receiver operational checking system of claim 4 further comprising light indicating means for each of said radio receivers to monitor visually said audio short noise pulse outputs of said receivers and to turn on when said short noise pulse output of said receivers coincide with said short pulses from said clock-driven pulse sources being applied to said squelch control connection points of said radio receivers as an indication of the operability of said receivers.

6. The radio receiver operational checking system of claim 5 further comprising audio signal responsive means for switching off said light indicating means for each of said receivers when each of said receivers is receiving a radio signal.

7. Method for checking the operational status of at least one radio receiver having a squelch circuit, comprising the steps of:
   (a) applying repetitive, short pulses to the squelch control connection point of said radio receiver to deactivate said squelch circuit at regular intervals to provide repetitive, short noise pulses in the audio output of said radio receiver, indicating that said radio receiver is operational and awaiting a radio frequency signal,
   (b) said repetitive short pulses applied to said squelch control connection point being of sufficiently short duration, so as to have a de minimus effect on the pilot or radio operator.

8. The method of claim 7 wherein said repetitive short pulses being of sufficiently short duration and small amplitude so as to be perceived almost subliminally by the pilot or radio operator.

9. The method of claim 7 further comprising the additional steps of applying said repetitive, short pulses (applied to the squelch control connection point of said radio receiver to deactivate said squelch circuit at regular intervals) are also applied to light indicating means to indicate that said radio receiver is operational and awaiting a radio frequency signal.

10. Method of checking the operational status of a plurality of radio receivers, each having a squelch circuit, comprising the steps of:
   (a) from separate, coordinated pulse sources, applying repetitive, short pulses to the squelch control connection point of each of said radio receivers to deactivate said squelch circuits at regular intervals, to provide repetitive, short, identifiable noise pulses in the audio output of said radio receivers, indicating which of said radio receivers are operational and awaiting a radio frequency signal, (b) spacing said repetitive short pulses, from each of said coordinated pulse sources to each of said receivers, in time and waveform such that the audible output of each of said radio receivers is audibly distinguishable from each other, (c) said repetitive short pulses applied to said squelch control connection points being of sufficiently short duration, so as to have a de minimus effect on the pilot or radio operator when present.

11. The method of claim 10 further comprising the additional steps of applying said repetitive, short pulses are also applied to light indicating means to indicate that said radio receivers are operational and awaiting radio frequency signals, wherein said light indicating means is normally switched off, but, in response to said repetitive, short pulses, is switched on.

12. The method of claim 11 further comprising the additional step of applying an audio signal responsive means to switch off said light indicating means for each of said receivers when either of said receivers is receiving a voice radio signal.

* * * * *

UNITED STATES PATENT AND TRADEMARK OFFICE
CERTIFICATE OF CORRECTION

PATENT NO. : 4,996,717
DATED : February 26, 1991
INVENTOR(S) : Robert H. Koenig

It is certified that error appears in the above-identified patent and that said Letters Patent is hereby corrected as shown below:

Title Page - Item 76:

The Inventors name should read: Robert H. Koenig

Item [19] should read --koenig--.

Signed and Sealed this

Eighth Day of October, 1991

*Attest:*

HARRY F. MANBECK, JR.

*Attesting Officer*      *Commissioner of Patents and Trademarks*